(12) United States Patent
Smith et al.

(10) Patent No.: US 8,902,560 B2
(45) Date of Patent: *Dec. 2, 2014

(54) ELECTROSTATIC CHUCK GROUND PUNCH

(75) Inventors: David B. Smith, Woburn, MA (US);
William D. Lee, Newburyport, MA
(US); Marvin R. LaFontaine, Kingston,
NH (US); Ashwin M. Purohit,
Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1370 days.

This patent is subject to a terminal disclaimer.

(21) Appl. No.: 12/262,990

(22) Filed: Oct. 31, 2008

(65) Prior Publication Data

US 2010/0110604 A1 May 6, 2010

(51) Int. Cl.
*H01L 21/683* (2006.01)
*H01T 23/00* (2006.01)

(52) U.S. Cl.
CPC ................... *H01L 21/6831* (2013.01)
USPC .......................................... 361/234

(58) Field of Classification Search
USPC .......................................... 361/234
See application file for complete search history.

(56) References Cited

U.S. PATENT DOCUMENTS

| | | | |
|---|---|---|---|
| 2,384,707 A | 9/1945 | Sweet | |
| 5,179,498 A * | 1/1993 | Hongoh et al. | 361/234 |
| 5,625,526 A * | 4/1997 | Watanabe et al. | 361/234 |
| 5,716,888 A * | 2/1998 | Lur et al. | 438/619 |
| 5,735,855 A | 4/1998 | Bradley | |
| 5,933,747 A * | 8/1999 | Gardner et al. | 438/424 |
| 6,202,029 B1 * | 3/2001 | Verkuil et al. | 702/64 |
| 6,778,258 B2 * | 8/2004 | del Puerto et al. | 355/72 |
| 7,336,471 B2 * | 2/2008 | Suehira et al. | 361/220 |
| 7,338,494 B2 | 3/2008 | Ryan | |
| 2010/0019462 A1 | 1/2010 | Chen et al. | |
| 2010/0103583 A1 | 4/2010 | Wang et al. | |
| 2010/0110603 A1 | 5/2010 | LaFontaine | |

FOREIGN PATENT DOCUMENTS

EP      0720217     *  7/1996

OTHER PUBLICATIONS

"Automatic Center Punch", reprinted from the Internet at: http://en.wikpedia.org/wiki/Automatic_center_punch, May 1, 2008, 2 pgs.
Office Action issued on Jun. 25, 2010 to U.S. Appl. No. 12/262,399.
Notice of Allowance issued on Dec. 20, 2010 to U.S. Appl. No. 12/262,399.
Notice of Allowance Dated Feb. 18, 2011 From U.S. Appl. No. 12/262,399. 17 Pages.

* cited by examiner

*Primary Examiner* — Jared Fureman
*Assistant Examiner* — Lucy Thomas
(74) *Attorney, Agent, or Firm* — Eschweiler & Associates, LLC

(57) ABSTRACT

An electrostatic chuck and method for clamping a workpiece is provided. The ESC comprises a clamping plate having a clamping surface, and one or more electrodes. An electric potential applied to the one or more electrodes selectively clamps the workpiece to the clamping surface. A punch is operably coupled to the clamping plate and an electrical ground, wherein the punch comprises a trigger mechanism and a punch tip. The punch tip translates between extended and retracted positions, wherein a point of the punch tip is proud of the clamping surface when the punch tip is in the extended position. The punch tip is configured to translate toward the clamping surface upon clamping the workpiece to the clamping plate. Upon reaching the retracted position, the trigger mechanism imparts an impact force to the punch tip, forcing the punch tip into the workpiece and providing an electrical ground connection to the workpiece.

16 Claims, 5 Drawing Sheets

ELECTROSTATIC CHUCK GROUND PUNCH

FIELD OF THE INVENTION

The present invention relates generally to electrostatic clamping systems and methods, and more specifically to electrostatic chuck having a mechanism for electrically grounding a workpiece.

BACKGROUND OF THE INVENTION

In the semiconductor industry, electrostatic chucks (ESCs) have been utilized in plasma-based or vacuum-based semiconductor processes such as etching, CVD, and ion implantation, etc. for a long time. Capabilities of the ESCs, including non-edge exclusion and wafer temperature control, have proven to be quite valuable in processing workpieces such as semiconductor substrates or wafers, (e.g., silicon wafers). A typical ESC, for example, comprises a dielectric layer positioned over a conductive electrode, wherein the semiconductor wafer is placed on a surface of the ESC (e.g., the wafer is placed on a surface of the dielectric layer). During semiconductor processing, a clamping voltage is typically applied between the wafer and the electrode, wherein the wafer is clamped against the chuck surface by electrostatic forces.

Declamping or un-sticking the wafer from the chuck surface, however, is a concern in many ESC applications. For example, Johnsen-Rahbek (J-R) effect-type ESCs have been developed in order to minimize the de-clamping problem by providing a purposely "leaky" dielectric such that the residual charges can be discharged more quickly. Wafer de-clamping problems in J-R type ESCs, however, can still be present, and are typically caused, at least in part, by charge migrating and accumulating to the backside insulator surface of the wafer. Another problem that can occur is when charge in the wafer builds up from the leakage in a J-R ESC, wherein eventually, the wafer will charge up to substantially the same charge of the ESC. In such an instance, there will be a negligible difference in charge between the ESC and the wafer, and the clamping forces on the wafer will be lost.

Thus, there is a need to provide a low resistance ground path from the wafer in order to provide proper charges in ESCs. Most semiconductor wafers, however, have some kind of oxide, nitride, or other insulative layer that prevents a simple electrical contact being touched to the backside of the wafer. Even wafers that have not yet undergone processing will typically have native oxide formed thereon. Thus, a need exists for a mechanism that is operable to penetrate through the oxide or other insulative layer on the wafer, wherein desired electrical behavior between the ESC and workpiece can be achieved.

SUMMARY OF THE INVENTION

The present invention overcomes the limitations of the prior art by providing an electrostatic chuck having a ground pin that is configured to penetrate insulative layers on the backside of a workpiece. The present invention further provides a method for grounding a workpiece by providing an impact force via a ground pin. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the invention, an electrostatic chuck for clamping a semiconductor workpiece is provided, wherein the electrostatic chuck comprises a clamping plate having a clamping surface defined thereon. One or more electrodes are associated with the clamping plate, wherein an electric potential applied to the one or more electrodes is operable to selectively electrostatically clamp the workpiece to the clamping surface of the clamping plate.

A punch is further operably coupled to the clamping plate, as well as to an electrical ground, wherein the punch comprises a trigger mechanism and a punch tip. The punch tip is configured to translate between an extended position and a retracted position, wherein a point of the punch tip generally stands proud of the clamping surface by a first distance when the punch tip is in the extended position. The point of the punch tip is further configured to translate toward the clamping surface upon the workpiece being clamped to clamping plate, and wherein upon reaching the retracted position, the trigger mechanism is configured to impart an impact force to the punch tip. The impact force provided by the punch tip thus forces the point of the punch tip into the backside of the workpiece, therein penetrating the insulative layer and providing an electrical connection between the workpiece and the electrical ground.

According to one example, the punch comprises a housing having a bore extending therethrough, wherein at least a portion of the punch tip is configured to linearly translate within the bore. The bore further has a constriction defined therein. Accordingly, the trigger mechanism described above further comprises a trip pin configured to translate within the bore upon the translation of the punch tip. The punch tip, for example, contacts the trip pin at a contact region thereof, wherein the trip pin comprises a taper and an engagement portion. The taper and engagement portion, for example, are configured to selectively extend through the constriction of the bore, and wherein an engagement between the taper and the constriction radially translates the engagement portion from an initial position offset with respect to an axis of the bore to a centered position with respect to the axis upon the translation of the punch tip from the extended position to the retracted position.

The trigger mechanism, for example, further comprises a hammer configured to linearly translate within the housing, wherein the hammer has a face and a recess defined therein. A spring is further provided, wherein the spring generally provides a bias to the hammer between the constriction and an end of the housing. The engagement portion of the trip pin generally contacts the face of the hammer when the trip pin is in the initial position, therein compressing the spring upon the translation of the punch tip from the extended position to the retracted position. Accordingly, the recess in the hammer thus receives the engagement portion of the trip pin upon the trip pin reaching the centered position, wherein the spring provides the impact force through the hammer onto the trip pin and punch tip.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
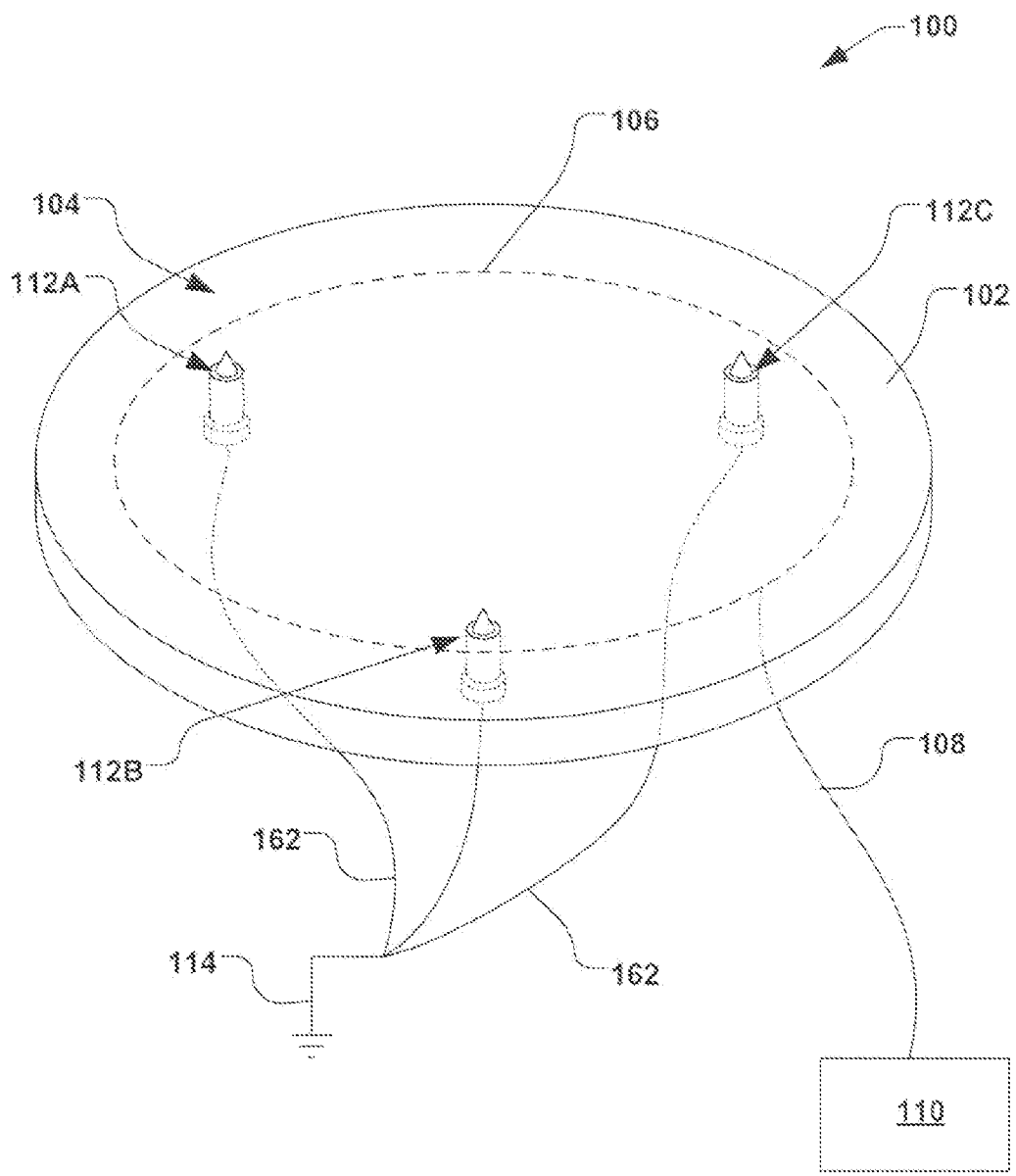
FIG. 1 is a perspective view of an exemplary electrostatic chuck according several aspects of the present invention.

The present invention is directed generally toward electrostatic chuck and method for clamping a workpiece, wherein an adequate electrical ground is provided between the electrostatic chuck and the workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exemplary electrostatic chuck (ESC) 100 in accordance with one aspect of the present invention. In one example, the electrostatic chuck 100 is a J-R type electrostatic chuck, however, other types of electrostatic chucks, such as coulombic electrostatic chucks, are also contemplated as falling within the scope of the present invention. The electrostatic chuck 100, for example, comprises a clamping plate 102 having a substantially planar clamping surface 104 defined thereon. One or more electrodes 106 are further associated with the clamping plate 102, wherein an electric potential 108 applied by a source 110 (e.g., a DC power source) to the one or more electrodes is operable to selectively electrostatically clamp a workpiece (not shown) to the clamping surface 104 of the clamping plate, as will be understood by one of ordinary skill in the art.

In accordance with one exemplary aspect, a punch 112 is operably coupled to the clamping plate 102 and an electrical ground 114. FIG. 1 illustrates three punches 112A-112C, however, any number of punches can be implemented in accordance with the present invention. Each punch 112, for example, comprises a trigger mechanism 116 and a punch tip 118, as illustrated in further detail in FIGS. 2A and 2B. The punch tip 118, for example, is configured to translate between an extended position 120 illustrated in FIG. 2A and a retracted position 122 illustrated in FIG. 2B. A point 124 of the punch tip 118, for example, is generally proud of the clamping surface 104 by a first distance 126 (e.g., between approximately 0.1 mm and 1 mm) when the punch tip is in the extended position 120 of FIG. 2A, and in one example, the point of the punch tip is generally co-planar with to slightly proud of the clamping surface in the retracted position 122 of FIG. 2B. The punch tip 118 is thus configured to translate toward the clamping surface 104 upon a workpiece (not shown) being clamped to clamping plate 102, as will be discussed further infra.

Figure 2A:
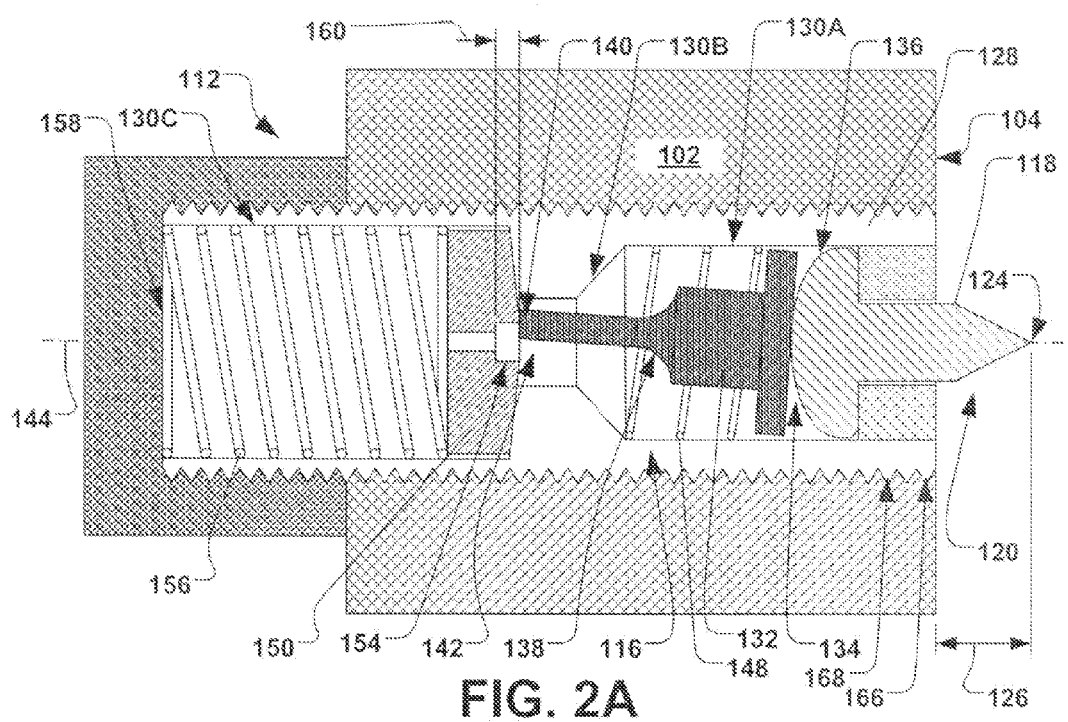
FIGS. 2A and 2B illustrate a partial cross-sectional views of an exemplary punch for an ESC in accordance with one aspect of the invention.
Figure 2B:
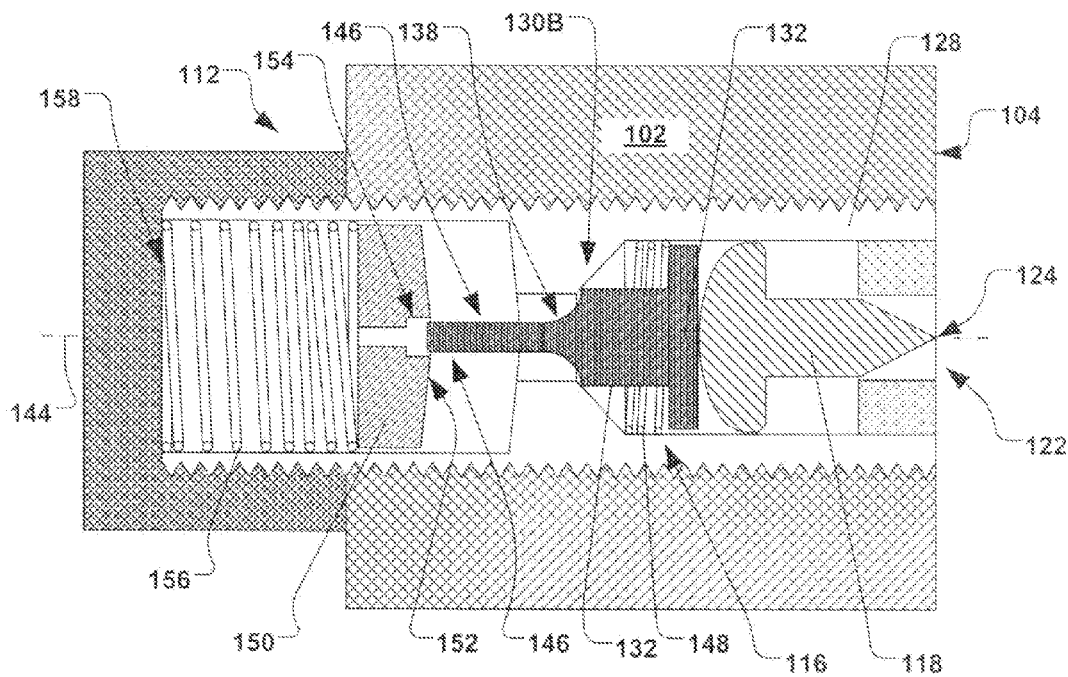

The punch 112 of FIGS. 2A-2B, for example, further comprises a housing 128 having a bore 130 extending therethrough, wherein at least a portion of the punch tip 118 is configured to linearly translate within the bore. The bore 130 of the housing 128, for example, has a first bore 130A, a constriction 130B (e.g., a frusto-conical constriction), and a second bore 130C defined therein. The trigger mechanism 116, for example, comprises a trip pin 132 configured to translate within the first bore 130A upon the translation of the punch tip 118, wherein the punch tip contacts the trip pin at a contact region 134 thereof. The punch tip 118, for example, comprises a rounded portion 136 at the contact region 134.

According to the present example, the trip pin 132 further comprises a taper 138 and an engagement portion 140, wherein the taper and engagement portion are configured to selectively engage and extend at least partially through the constriction 130B. Accordingly, an engagement between the taper 138 and the constriction 130B is operable to radially translate the engagement portion 140 (and thus, the trip pin 132) from an initial position 142 offset with respect to an axis 144 of the bore 130 as illustrated in FIG. 2A to a centered position 146 with respect to the axis illustrated in FIG. 2B upon the translation of the punch tip 118 from the extended position 120 to the retracted position 122. An offset spring 148, for example, generally biases the trip pin 132 toward the initial position 142 of FIG. 2A, wherein the taper 138 and constriction 130B act against the offset spring during the translation of the punch tip 118 and trip pin.

A hammer 150 is further provided, wherein the hammer is configured to linearly translate within the second bore 130C of the housing 128. The hammer 150, for example, has a face 152, wherein a recess 154 is further defined therein, as illustrated in FIG. 2B. The recess 154, for example, is configured to accept the engagement portion 140 of the trip pin 132, as will be discussed further infra.

A spring 156 is further provided, wherein the spring generally biases the hammer 150 between the constriction 130B and a butt end 158 of the housing 128, wherein the engagement portion 140 of the trip pin 132 generally contacts the face 152 of the hammer when the trip pin is in the initial position 142 of FIG. 2A. Thus, upon the translation of the punch tip 118 from the extended position 120 of FIG. 2A to the retracted position 122 of FIG. 2B, the spring 156 is compressed until the engagement between the taper 138 and the constriction 130B is radially translates the engagement portion 140 to the centered position 146, wherein upon reaching the retracted position 122 of FIG. 2B, the trigger mechanism 116 is configured to impart an impact force to the punch tip 118 via the recess 154 in the hammer 150 suddenly receiving the engagement portion of the trip pin 132. Thus, a combination of a depth 160 of the recess 154 and the configuration of the spring 156 (e.g., the spring constant, length, etc.) provides the impact force through the hammer onto the trip pin and punch tip.

Accordingly, as will be discussed hereafter, the point 124 of the punch tip 118 is impacted into the workpiece (not shown), therein providing an electrical connection between the workpiece and the electrical ground 114 of FIG. 1. For example, the punch 112 is comprised of electrically conductive materials, such that a wire 162 connected to each punch can be electrically connected to the electrical ground 114. The punch tip 118, for example, is comprised of a substantially hard material such as tungsten or boron carbide, wherein the punch tip can be repeatedly used while incurring little wear or dulling thereof.

In accordance with another example, as illustrated in FIG. 2A, the clamping plate 102 comprises a hole 164 extending therethrough, wherein at least a portion of the hole has an internal thread 166, and wherein at least a portion of the housing 128 has an external thread 168 configured to engage the internal thread of the hole, therein fastening the punch 112 to the clamping plate. In another example, the punch 112 further comprises a butt cap 170 having an internal thread 172 configured to engage the external thread 168 of the housing 128, and wherein the butt cap generally fastens the housing to the clamping plate 102. Accordingly, the housing 128 can be selectably positioned and fastened with respect to the clamping plate 102 by a combination of the respective threaded positions of the housing, butt cap 170, and internal thread 166 of the clamping plate 102. Thus, a clamp end 174 of the punch can be selectively positioned with respect to the clamping surface 104 (e.g., recessed or coplanar).

Figure 3A:
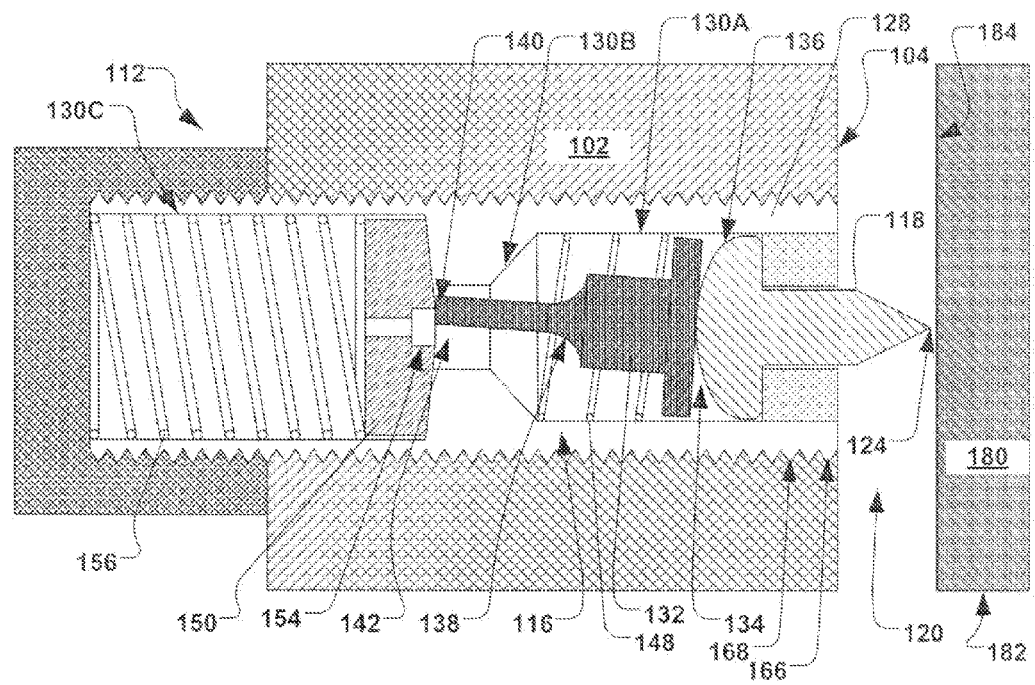
FIGS. 3A-3D illustrate partial cross-sectional views of an exemplary punch coupled to an ESC in accordance with various aspects of the invention.
Figure 3B:
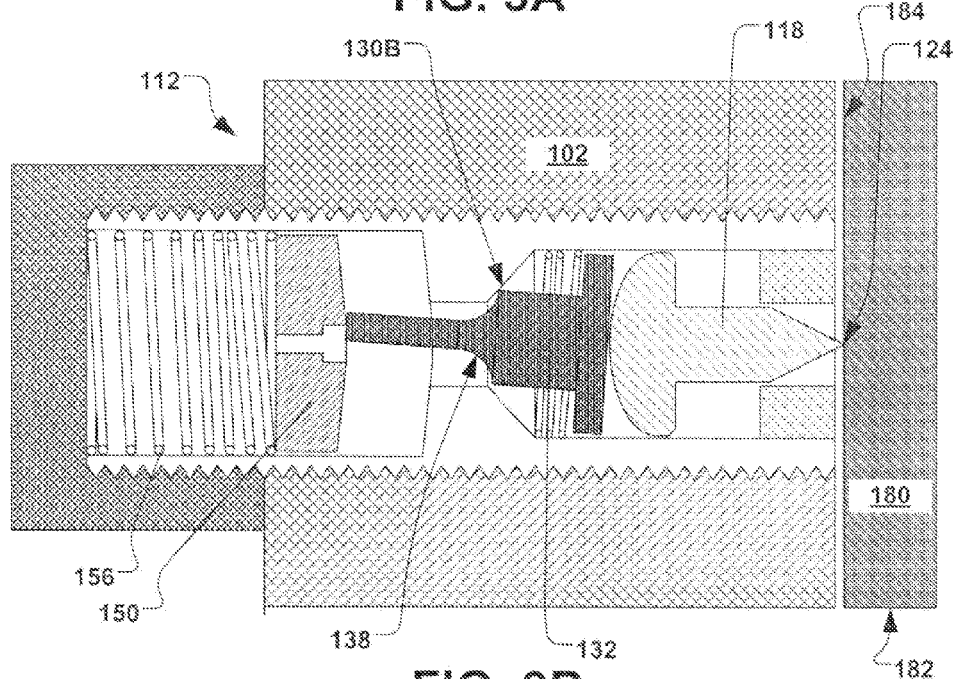
Figure 3C:
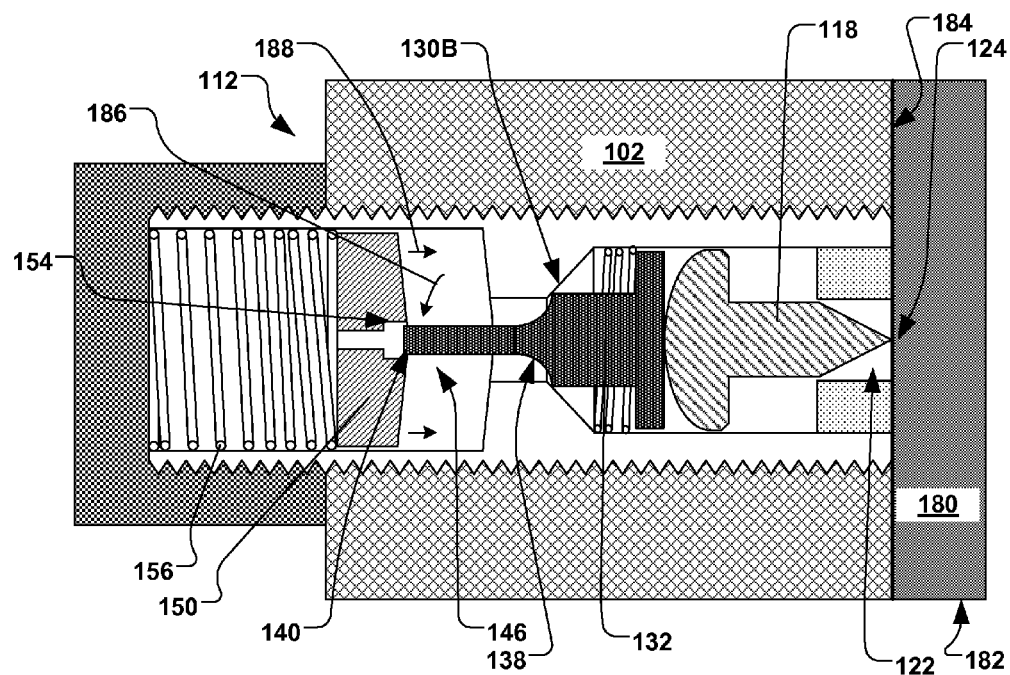
Figure 3D:
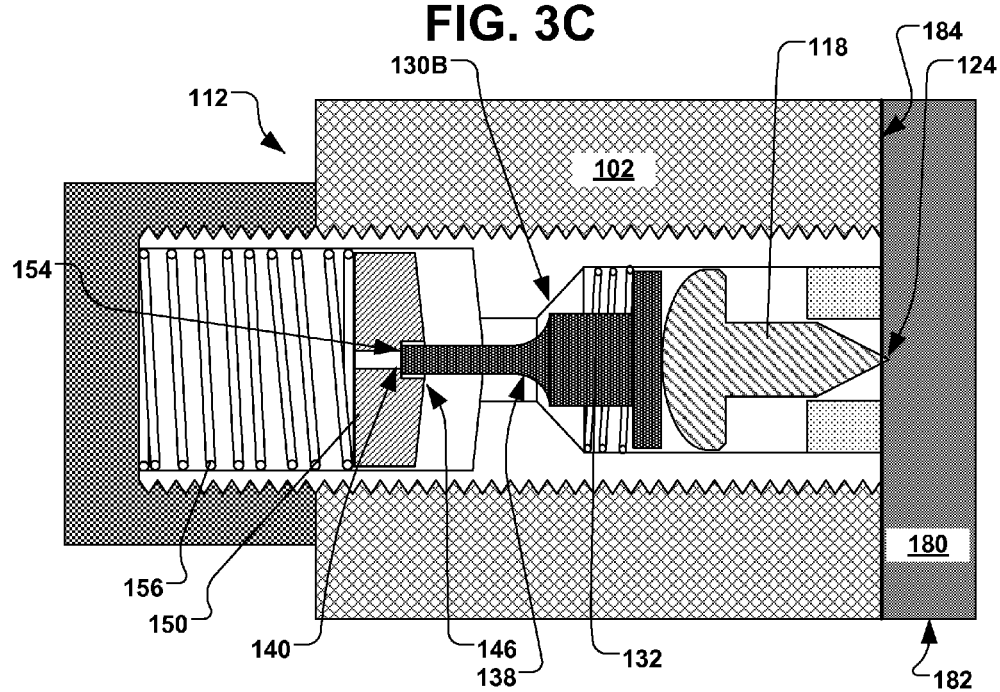
Figure 4:
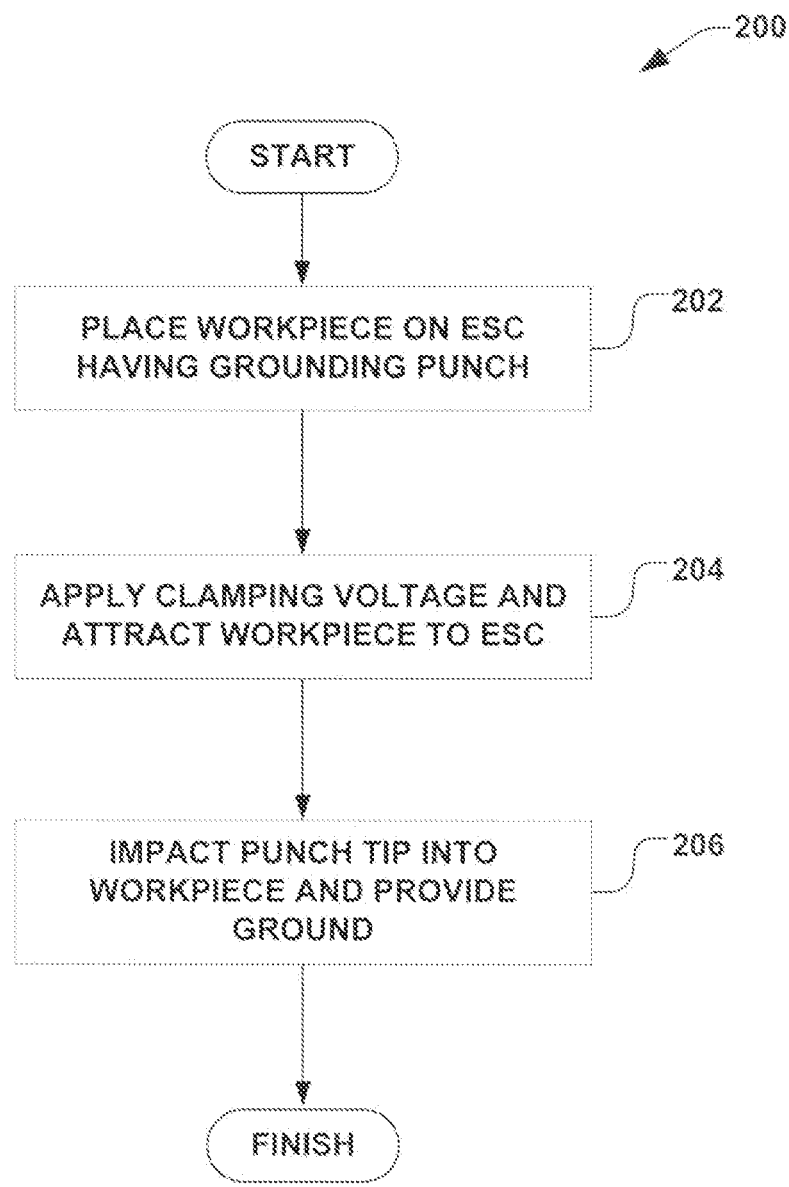
FIG. 4 illustrates an exemplary method for grounding an electrostatically clamped workpiece in accordance with a further exemplary aspect of the present invention.

FIGS. 3A-3D illustrate the punch 112 in various positions, as will be further discussed in accordance with another aspect of the present invention. FIG. 4, for example, illustrates an exemplary method 200 for grounding a workpiece during electrostatic clamping of the workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, wherein a workpiece having electrically insulative layer formed thereover is placed on a clamping surface of the electrostatic chuck, wherein one or more electrically grounded punch tips generally protrude from the clamping surface and contact the electrically insulative layer. As illustrated in FIG. 3A, the workpiece 180 is placed on the clamping surface 104 of the clamping plate 102, wherein the point 124 of the punch tip 118 contacts the workpiece 180, and wherein the punch tip is in the extended position 120. It should be noted that while act 202 is described as placing the workpiece on the clamping surface, the workpiece generally does not contact the clamping surface, but rather, generally contacts only the punch tip(s) 118. The workpiece 180, for example, comprises a semiconductor substrate 182 (e.g., silicon or germanium) having a nonconductive insulating layer 184 (e.g., an oxide or nitride layer) formed thereover. A thickness of the nonconductive layer 184 ranges from approximately 70 angstroms (e.g., a bare oxide layer) to 20,000 angstroms or more (e.g., a deposited or otherwise formed oxide or nitride layer).

In act 204 of FIG. 4, a clamping voltage is applied to one or more electrodes, wherein the workpiece is electrostatically attracted to the clamping surface. The attraction of the workpiece 180 thus generally translates the one or more punch tips 118 toward the clamping surface 104, as illustrated in FIG. 3B. For example, the electrostatic force between the workpiece 180 and clamping plate 102 generally overcomes the force from the spring 156, therein pushing the punch tip 118 into the first bore 130A of the housing 128. The punch tip 118 continues to travel into the housing 118 until it reaches the retracted position 122, as illustrated in FIG. 3C. Thus, upon the translation of the punch tip 118 from the extended position 120 of FIG. 3A to the retracted position 122 of FIG. 3C, the spring 156 is compressed and the engagement between the taper 138 and the constriction 130B radially translates the engagement portion 140 to the centered position 146 (indicated by arrow 186).

Upon reaching the retracted position 122, the engagement portion 140 of the trip pin 132 is no longer hindered by the face 152 of the hammer 150, and the trigger mechanism 116 imparts an impact force (indicated by arrow 188) to trip pin and punch tip 118 via the recess 154 in the hammer suddenly receiving the engagement portion of the trip pin. Thus, in act 206, and as illustrated in FIG. 3D, the point 124 of the punch tip 118 is plunged into the workpiece 180 with enough kinetic energy to substantially break through the nonconductive insulative layer 184 to the substrate 182 of the workpiece. As the punch 112 is electrically connected to ground (as illustrated in FIG. 1), the electrical ground connection to the workpiece is thus attained for satisfactory clamping and de-clamping of the workpiece.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic chuck for clamping a semiconductor workpiece, the electrostatic chuck comprising:
   a clamping plate having a clamping surface defined thereon;
   one or more electrodes associated with the clamping plate, wherein an electric potential applied to the one or more electrodes is operable to selectively electrostatically clamp the workpiece to the clamping surface of the clamping plate; and
   a punch operably coupled to the clamping plate and an electrical ground, wherein the punch comprises a trigger mechanism and a punch tip, wherein the punch tip is configured to translate between an extended position and a retracted position, wherein a point of the punch tip is proud of the clamping surface by a first distance when the punch tip is in the extended position, and wherein the point of the punch tip is configured to translate toward the clamping surface upon the workpiece being clamped to clamping plate, wherein upon reaching the retracted position, the trigger mechanism is configured to impart an impact force to the punch tip, therein forcing the point of the punch tip into the workpiece and providing an electrical connection between the workpiece and the electrical ground.

2. The electrostatic chuck of claim 1, wherein the punch further comprises a housing having a bore extending therethrough, wherein at least a portion of the punch tip is configured to linearly translate within the bore, and wherein the bore has a constriction defined therein, and wherein the trigger mechanism comprises:
   a trip pin configured to translate within the bore upon the translation of the punch tip, wherein the punch tip contacts the trip pin at a contact region thereof, wherein the trip pin comprises a taper and an engagement portion, wherein the taper and engagement portion are configured to selectively extend through the constriction of the bore, and wherein an engagement between the taper and the constriction radially translates the engagement portion from an initial position offset with respect to an axis of the bore to a centered position with respect to the axis upon the translation of the punch tip from the extended position to the retracted position; and
   a hammer configured to linearly translate within the housing, the hammer having a face and a recess defined therein;
   a spring, wherein the spring generally biases the hammer between the constriction and an end of the housing, wherein the engagement portion of the trip pin generally contacts the face of the hammer when the trip pin is in the initial position, therein compressing the spring upon the translation of the punch tip from the extended position to the retracted position, and wherein the recess in the hammer receives the engagement portion of the trip pin upon the trip pin reaching the centered position, wherein the spring provides the impact force through the hammer onto the trip pin and punch tip.

3. The electrostatic chuck of claim 2, wherein the clamping plate comprises a hole extending therethrough, wherein at least a portion of the hole has an internal thread, and wherein at least a portion of the housing has an external thread configured to engage the internal thread of the hole, therein fastening the punch to the clamping plate.

4. The electrostatic chuck of claim 2, wherein the punch further comprises a butt cap having an internal thread configured to engage the external thread of the housing, and wherein the butt cap generally fastens the housing to the clamping plate.

5. The electrostatic chuck of claim 1, wherein the clamping plate comprises a Johnsen-Rahbek material.

6. The electrostatic chuck of claim 1, wherein the trigger mechanism further comprises an offset spring, wherein the offset spring generally biases the trip pin from the centered position.

7. The electrostatic chuck of claim 1, wherein the first distance is between approximately 0.1 mm and 1 mm.

8. The electrostatic chuck of claim 1, wherein the punch is comprised of one or more electrically conductive materials.

9. The electrostatic chuck of claim 1, wherein the punch tip is comprised of tungsten or boron carbide.

10. The electrostatic chuck of claim 1, further comprising providing a DC power source electrically connected to the one or more electrodes, therein defining a DC electrostatic chuck.

11. The electrostatic chuck of claim 2, wherein a depth of the recess and the a force of the spring generally determines the impact force.

12. The electrostatic chuck of claim 1, wherein the semiconductor workpiece comprises a substrate comprised of one or more of silicon and germanium.

13. The electrostatic chuck of claim 1, wherein the semiconductor workpiece comprises a nonconductive layer formed over the semiconductor substrate, and wherein the point of the punch tip is configured to penetrate through the nonconductive layer into the semiconductor substrate, therein providing the electrical connection between the workpiece and the electrical ground.

14. The electrostatic chuck of claim 13, wherein the nonconductive layer is comprised of one or more of silicon dioxide and silicon nitride.

15. The electrostatic chuck of claim 13, wherein the nonconductive layer comprises a bare oxide having a thickness of approximately 70 angstroms.

16. The electrostatic chuck of claim 13, wherein the nonconductive layer has a thickness of approximately 20,000 angstroms or more.

* * * * *